United States Patent
Song et al.

(10) Patent No.: US 11,955,954 B2
(45) Date of Patent: Apr. 9, 2024

(54) SEMICONDUCTOR CIRCUIT BREAKER

(71) Applicant: LS ELECTRIC CO., LTD., Anyang-si (KR)

(72) Inventors: Woonghyeob Song, Anyang-si (KR); Jungwook Sim, Anyang-si (KR); Chaeyoon Bae, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 274 days.

(21) Appl. No.: 17/606,945

(22) PCT Filed: Mar. 19, 2020

(86) PCT No.: PCT/KR2020/003760
§ 371 (c)(1),
(2) Date: Oct. 27, 2021

(87) PCT Pub. No.: WO2020/222424
PCT Pub. Date: Nov. 5, 2020

(65) Prior Publication Data
US 2022/0209765 A1    Jun. 30, 2022

(30) Foreign Application Priority Data
Apr. 29, 2019  (KR) .......... 10-2019-0050064

(51) Int. Cl.
*H03K 17/081* (2006.01)
*H01C 7/12* (2006.01)
(Continued)

(52) U.S. Cl.
CPC ........ *H03K 17/08104* (2013.01); *H01C 7/12* (2013.01); *H02H 9/005* (2013.01);
(Continued)

(58) Field of Classification Search
CPC ............ H02H 3/22; H02H 9/02; H02H 9/005; H02H 9/00; H02H 9/04; H03K 17/08104;
(Continued)

(56) References Cited

U.S. PATENT DOCUMENTS

| 5,627,720 A | * | 5/1997 | Lewis | .................... H02B 1/056 |
| | | | | 361/627 |
| 7,177,128 B2 | * | 2/2007 | Yamamoto | ............ H02M 7/003 |
| | | | | 257/E25.024 |

(Continued)

FOREIGN PATENT DOCUMENTS

| KR | 20050057132 A | 6/2005 |
| KR | 100927090 B1 | 11/2009 |

(Continued)

OTHER PUBLICATIONS

International Search Report for related International Application No. PCT/KR2020/003760; report dated Nov. 5, 2020; (5 pages).

(Continued)

*Primary Examiner* — Danny Nguyen
(74) *Attorney, Agent, or Firm* — K&L Gates LLP (57) ABSTRACT

The present disclosure relates to a semiconductor circuit breaker and, more specifically, to a semiconductor circuit breaker in which a protection circuit is modularized and thus maintenance and repair can be easily done. A semiconductor circuit breaker according to an embodiment of the present disclosure comprises: a main circuit unit connected between a power source and a load and having a semiconductor switch; an outer box equipped with the main circuit unit and having a module accommodation unit outside thereof; and a protection module detachably accommodated in the module accommodation unit.

9 Claims, 6 Drawing Sheets

(51) Int. Cl.
*H02H 9/00* (2006.01)
*H02H 9/04* (2006.01)
*H01C 7/108* (2006.01)
*H01C 7/112* (2006.01)

(52) U.S. Cl.
CPC ............... *H02H 9/04* (2013.01); *H01C 7/108* (2013.01); *H01C 7/112* (2013.01)

(58) Field of Classification Search
CPC ..... H03K 2217/0009; H03K 17/08142; H01C 7/108; H01C 7/12; H01H 71/02; H01H 71/0207; H01H 83/10
USPC ....................................... 361/2–13
See application file for complete search history.

(56) References Cited

U.S. PATENT DOCUMENTS

| | | | |
|---|---|---|---|
| 9,875,830 B1 | 1/2018 | Gattis | |
| 2012/0206848 A1* | 8/2012 | Gillespie | H02H 9/02 |
| | | | 361/104 |
| 2013/0009491 A1* | 1/2013 | Hafner | H03K 17/785 |
| | | | 307/113 |
| 2015/0214700 A1* | 7/2015 | Bergeron | H04Q 1/116 |
| | | | 361/119 |
| 2015/0318687 A1* | 11/2015 | Lagree | H01H 71/0228 |
| | | | 361/93.1 |
| 2019/0013119 A1* | 1/2019 | Tschida | H01L 23/46 |

FOREIGN PATENT DOCUMENTS

| | | |
|---|---|---|
| KR | 20160018003 A | 2/2016 |
| KR | 101700657 B1 | 2/2017 |
| WO | 2018080645 A1 | 5/2018 |

OTHER PUBLICATIONS

Written Opinion for related International Application No. PCT/KR2020/003760; report dated Nov. 5, 2020; (5 pages).
Office Action for related Korean Application No. 10-2019-0050064; action dated Jan. 5, 2024; (5 pages).

* cited by examiner

Fig. 1

Prior Art

SEMICONDUCTOR CIRCUIT BREAKER

CROSS-REFERENCE TO RELATED APPLICATIONS

This application is the National Stage filing under 35 U.S.C. 371 of International Application No. PCT/KR2020/003760, filed on Mar. 19, 2020, which claims the benefit of earlier filing date and right of priority to Korea utility model Application No. 10-2019-0050064 filed on Apr. 29, 2019, the contents of which are all hereby incorporated by reference herein in their entirety.

FIELD

The present disclosure relates to a semiconductor circuit breaker, and more particularly, to a semiconductor circuit breaker having a modularized protection circuit for easier maintenance and repair.

BACKGROUND

A protection circuit (safety circuit) or a safety element is usually used in a semiconductor circuit breaker to protect a semiconductor from damage caused by a voltage generated when switched on or off. A snubber circuit is one of examples of such a protection circuit. Similarly, a protection circuit such as a snubber circuit is used in a power semiconductor circuit breaker for the purpose of reducing a voltage upon switching.

Examples of snubber circuits may include a capacitor (C) snubber circuit, a resistor-capacitor (RC) snubber circuit, a charge-discharge type resistor-capacitor-diode (RCD) snubber circuit, and a discharge-suppressing type snubber circuit.

In addition, according to a system, a metal oxide varistor (MOV) may be additionally provided as a protection element. The MOV, which is one of components used for surge protection, is applied to part of a circuit to prevent damage of electrical and electronic devices from surges. The MOV, which is a varistor made of zinc oxide, is a transient voltage suppression device. The MOV starts conduction when electric potential is higher than a specific value. Accordingly, a fuse in the circuit is not required.

Figure 1:
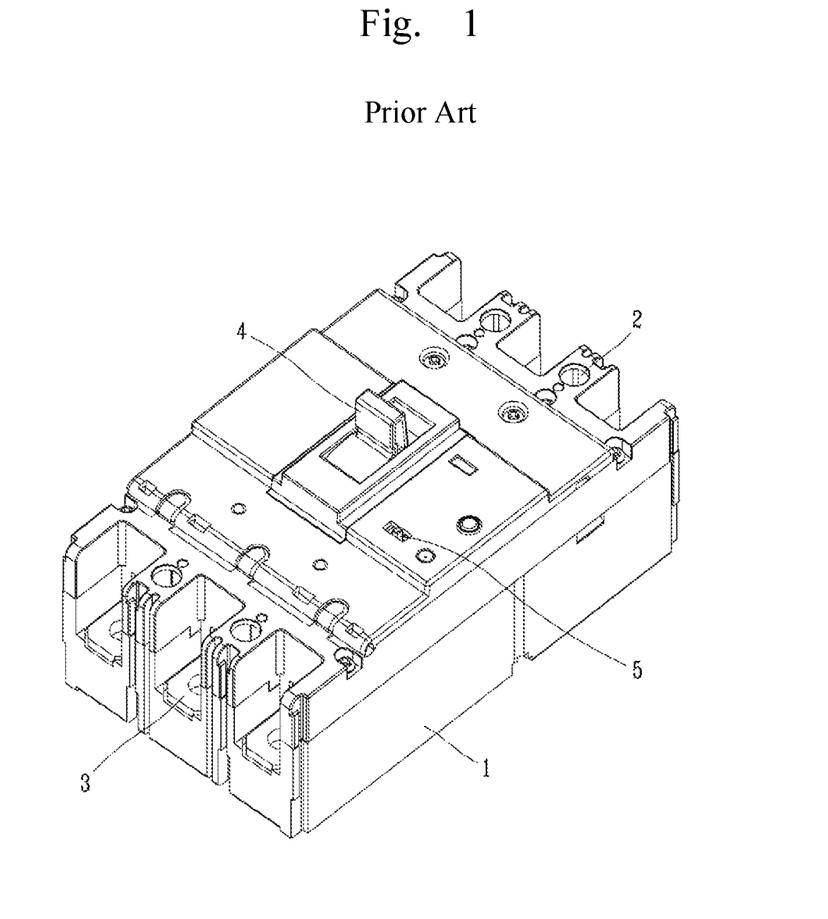
FIG. 1 is a perspective view of a semiconductor circuit breaker according to the related art.

The semiconductor circuit breaker having such a configuration is implemented as a general circuit breaker structure as shown in FIG. 1. Referring to FIG. 1, one or more circuit breaker input terminal parts 2 and one or more circuit breaker output terminal parts 3 are disposed at both ends of a frame body 1 that defines a body. A manual switch (a button or slide type) 4 for activating a switch and a reset button 5 for re-connection after tripping a circuit breaker due to a line failure are provided on an upper portion of the frame body 1. In addition, a semiconductor device, a control circuit, a snubber circuit, an MOV, and the like are disposed in the frame body 1.

The semiconductor circuit breaker has a complex configuration in which a semiconductor device and various electrical and electronic components are used.

In such a related art semiconductor circuit breaker, its internal components should be replaced when the capacity of the circuit breaker is changed. In this case, the internal components including a main circuit and a protection circuit should be replaced at the same time, causing inconvenience. If the main circuit and the protection circuit are integrally formed, it is not suitable for maintenance and repair.

SUMMARY

The present disclosure is directed to solving the above-described problems. The present disclosure describes a semiconductor circuit breaker having an attachable and detachable protection circuit module.

According to one aspect of the subject matter described in this application, a semiconductor circuit breaker includes: a main circuit unit connected between a power source and a load, and provided with a semiconductor switch; an enclosure having the main circuit unit embedded therein and a module accommodating unit provided at an outside thereof; and a protection module detachably accommodated in the module accommodating unit.

Implementations according to this aspect may include one or more of the following features. For example, the protection module may include a first protection module in which a snubber circuit unit for protecting the semiconductor switch is embedded.

In some implementations, the protection module may include a second protection module in which a metal oxide varistor (MOV) for protecting the semiconductor switch is embedded.

In some implementations, the module accommodating unit may be configured as a groove on a portion of the enclosure.

In some implementations, the module accommodating unit may be provided with a connection socket connected to the power source or a ground.

In some implementations, the connection socket may include a first connection socket to which the first protection module is connected, and a second connection socket to which the second protection module is connected.

In some implementations, the first protection module may be provided with a first connection terminal that is connected to the first connection socket, and the second protection module may be provided with a second connection terminal that is connected to the second connection socket.

In some implementations, a guide portion for guiding and supporting insertion and mounting of the protection module may be formed at the module accommodating unit, and a guide inserted into the guide portion may be formed at the protection module.

In some implementations, the semiconductor switch may include a first semiconductor switch and a second semiconductor switch that are symmetrical to each other, so as to operate in response to currents flowing in opposite directions, respectively.

In some implementations, the snubber circuit unit may include: a first circuit line in which a first capacitor and a first diode are arranged in series; a second circuit line connected in parallel with the first circuit line, and in which a second capacitor and a second diode are arranged in series; and a third circuit line having one end connected to the first circuit line and the other end connected to the second circuit line, and in which a first resistor and a second resistor are arranged in series. A ground terminal connected between front and rear ends of the first circuit line or the second circuit line, and a ground terminal connected between the first and second resistors of the third circuit line may be connected to the first connection terminal.

In some implementations, one end and the other end of the MOV may be connected to front and rear ends of the semiconductor switch, respectively.

In a semiconductor circuit breaker according to implementations of the present disclosure, a protection circuit such as a snubber circuit is configured as a module that is attachable and detachable to and from an enclosure, making it suitable for capacity change or maintenance and repair.

Accordingly, there is no need to replace the entire circuit of the circuit breaker including a main circuit to thereby achieve a cost reduction.

DETAILED DESCRIPTION

Hereinafter, preferred implementations of the present disclosure will be described with reference to the accompanying drawings, so that a person skilled in the art can easily carry out the disclosure. It should be understood that the technical idea and scope of the present disclosure are not limited to those preferred implementations.

Figure 2:
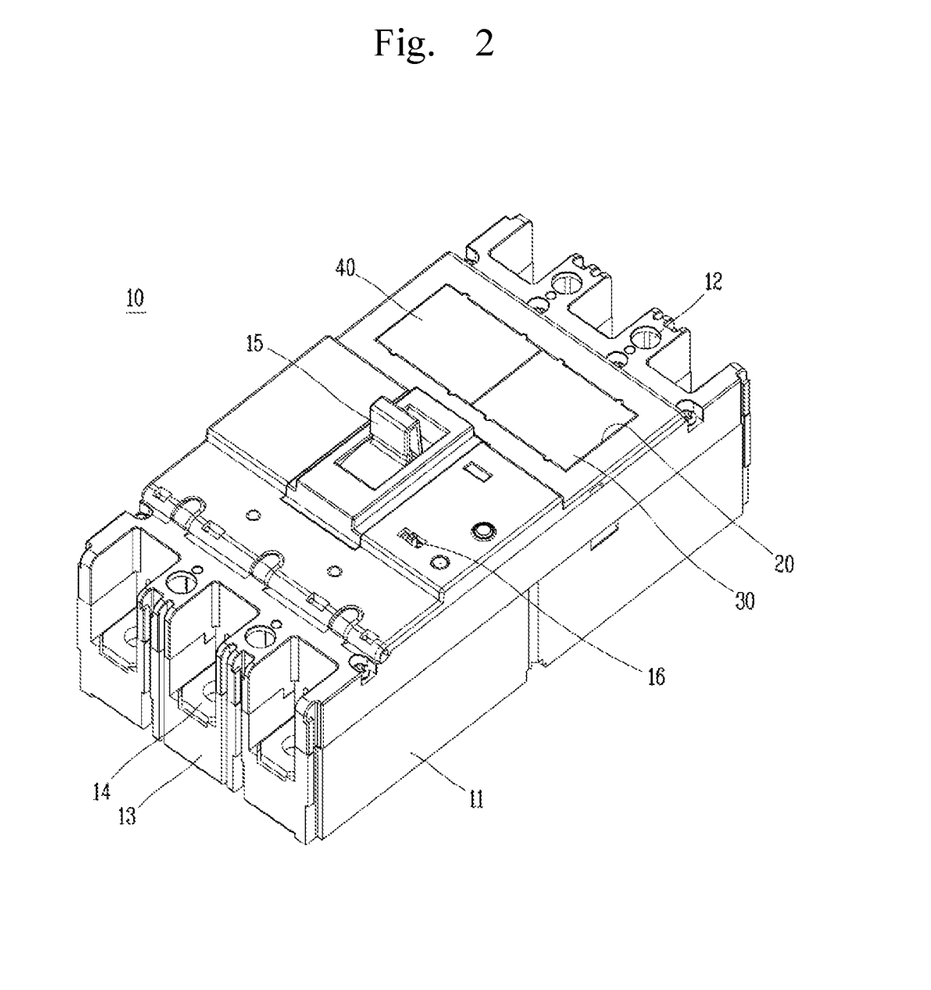
FIG. 2 is a perspective view of a semiconductor circuit breaker according to one implementation of the present disclosure.
Figure 3:
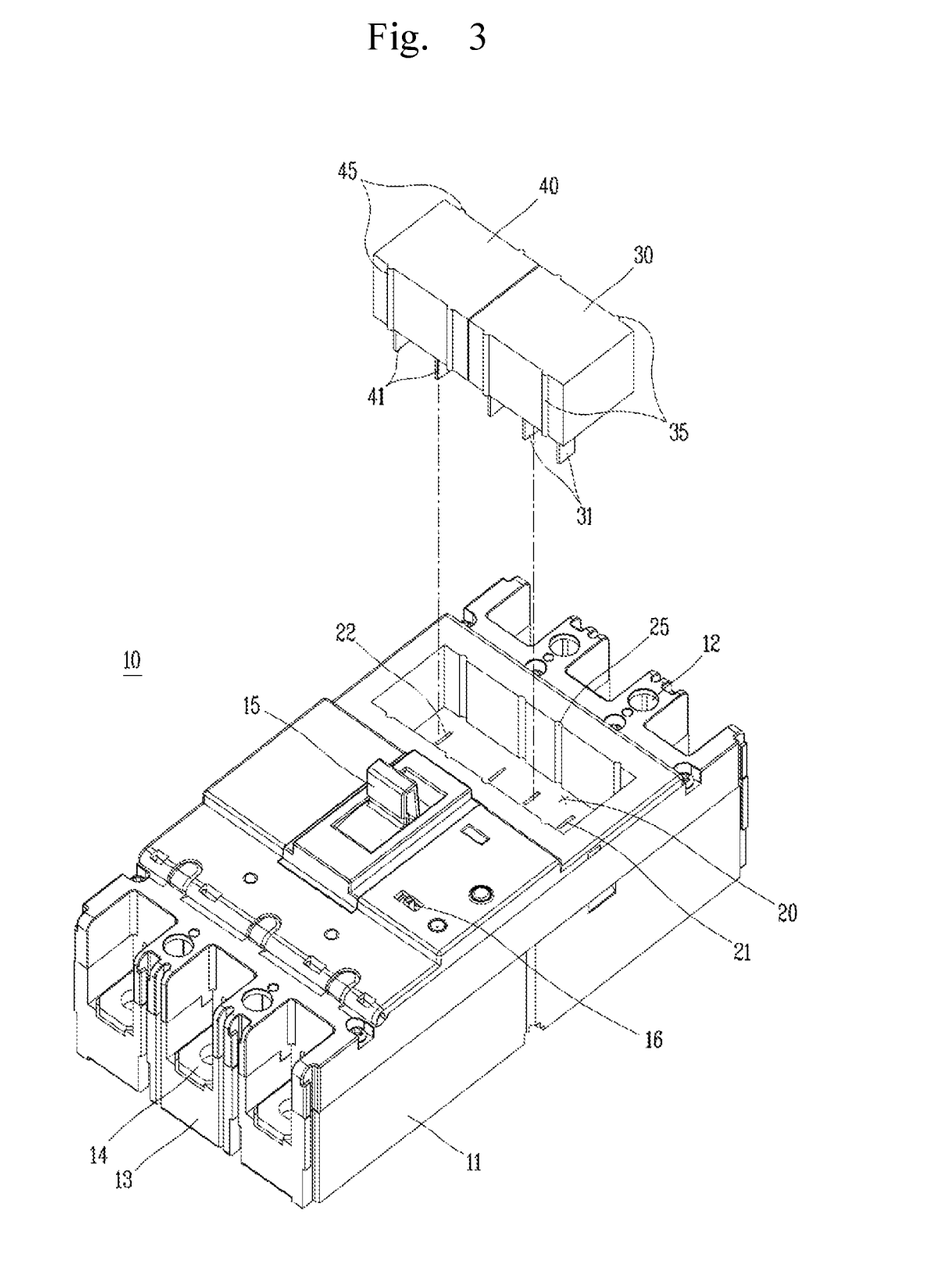
FIG. 3 is a perspective view illustrating a disassembled state of a protection module in FIG. 2.
Figure 4:
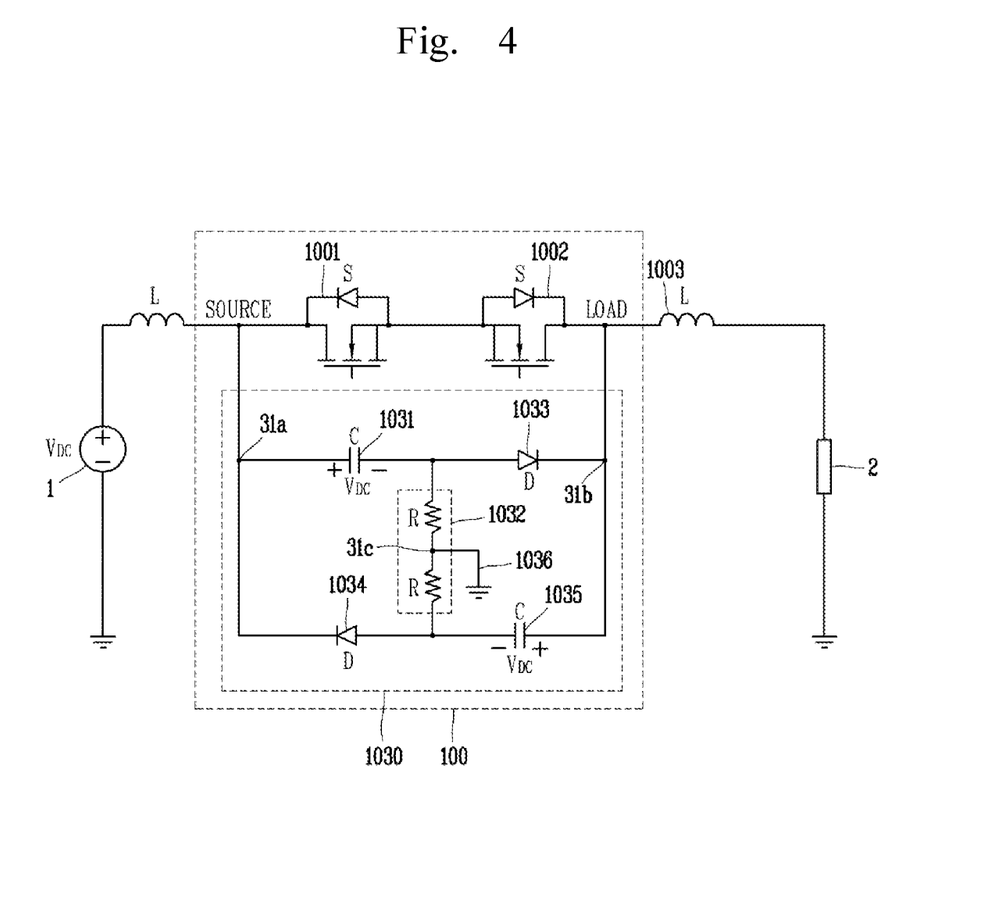
FIG. 4 is a circuit diagram of a bidirectional semiconductor circuit breaker according to one implementation of the present disclosure.

FIG. 2 is a perspective view of a semiconductor circuit breaker according to one implementation of the present disclosure, FIG. 3 is a perspective view illustrating a disassembled state of a protection module in FIG. 2, and FIG. 4 is a circuit diagram of a bidirectional semiconductor circuit breaker according to one implementation of the present disclosure. A semiconductor circuit breaker according to implementations of the present disclosure will be described in detail with reference to the drawings.

A semiconductor circuit breaker 10 according to one implementation of the present disclosure includes a main circuit unit (or main circuit) connected between a power source 1 and a load 2 and having semiconductor switches 1001 and 1002, an enclosure (or outer box) 11 in which the main circuit unit is embedded and having a module accommodating unit 20 provided at an outside thereof, and a protection module (30, 40) detachably accommodated in the module accommodating unit 20.

The enclosure 11 of the semiconductor circuit breaker 10 may be formed in a box shape. The enclosure 11 may be made of an insulating material.

The semiconductor circuit breaker 10 may include a terminal unit (12, 13) including a (power) source-side terminal part (input terminal part) 13 to which the power source 1 is connected and a load-side terminal part (output terminal part) 12 to which the load 2 is connected, a contact part including a fixed contact and a movable contact that connects or blocks a circuit by being separated from or in contact with the fixed contact, an opening and closing mechanism including a handle 15, which is manipulated by a user, to operate the movable contact, a detection mechanism that operates the opening and closing mechanism when detecting a flow of fault current, a trip unit, and an arc extinguishing unit for efficiently extinguishing an arc generated when the contact part is separated or disconnected. The components responsible for the respective functions are built or embedded in the enclosure 11.

The source-side terminal part 13 that is connected to the power source 1 is provided at one end portion of the enclosure 11, and the load-side terminal part 12 that is connected to the load 2 is provided at another end portion of the enclosure 11.

Terminals are installed at each of the terminal parts 12 and 13. That is, a load-side terminal (not shown) is installed in the load-side terminal part 12 to be exposed thereto, and a source-side terminal 14 is installed at the source-side terminal part 13 to be exposed thereto.

Partition walls are provided at the source-side terminal part (input terminal part) 13 to separate or divide phases. Terminals of the respective phases are divided by the partition walls or side walls. Matters (or configurations) applied to the source-side terminal part 13 may be equally applied to the load-side terminal part 12.

The handle 15 configured to be manipulated by a user is provided on an upper portion of the enclosure 11 to open and close the contact part.

In addition, a reset button 16 is provided on one side of the handle 15 for re-connection after the circuit breaker trips in the event of a fault current. The reset button 16 is used for re-connection after the trip operation.

The enclosure 11 is provided therein with a circuit including a controller (or control unit) for controlling a semiconductor device connected to the source-side terminal part 13 and the load-side terminal part 12.

The module accommodating unit 20 is provided at the enclosure 11. The module accommodating unit 20 may be provided on the upper portion of the enclosure 11 in the form of a groove. However, this is merely illustrative, and other various examples may also be possible.

A connection socket (21, 22) is provided at the module accommodating unit 20. The connection socket (21, 22) may include first connection sockets 21 and second connection sockets 22. The connection socket (21, 22) includes a terminal connected to a power circuit in the enclosure 11 to be connected to the power source 1 and a terminal connected to a ground.

Guide portions 25 for guiding and supporting insertion and mounting of the protection module (30, 40) may be formed at the module accommodating unit 20.

The protection module (30, 40) configured to be attachable and detachable to and from the module accommodating unit 20 is provided. The protection module (30, 40) may include a first protection module 30 and a second protection module 40. Here, the first protection module 30 may be a snubber circuit module, and the second protection module 40 may be an MOV module.

The first and second protection modules 30 and 40 may be provided with connection terminals 31 and 41, so as to be connected to the first and second connection sockets 21 and 22, respectively.

When the protection modules 30 and 40 are mounted on the module accommodating unit 20, and the connection terminals 31 and 41 are connected to the connection sockets 21 and 22, respectively, protection circuits or protection elements of the protection modules 30 and 40 are connected to the source circuit and the main circuit.

Guides 35 and 45 fitted to the guide portions 25 of the module accommodating unit 20 are provided at the protection modules 30 and 40, respectively. The guide portions 25 and the guides 35 and 45 may be formed as grooves and protrusions (or ribs), respectively.

In a bidirectional DC system, a circuit breaker with bidirectional interruption capability is required. Accordingly, when a bidirectional solid-state circuit breaker (SSCB) is applied, a protection circuit that enables bidirectional operation is used to stably interrupt a fault current. As described above, a snubber circuit may be used for a protection circuit.

The snubber circuit for semiconductor protection can be divided into two cases. One is to apply two unidirectional snubber circuits to enable bidirectional interruption, and the other is to apply a high-performance snubber circuit with bidirectional interruption capability.

Referring to FIG. 4, an entire (or whole) circuit 100 of a bidirectional circuit breaker includes a main circuit unit (or main circuit) connected between the power source 1 and the load 2. Here, the main circuit unit includes a first semiconductor switch (MOSFET switch) 1001 and a second semiconductor switch (MOSFET switch) 1002 connected in series. The first semiconductor switch (MOSFET switch) and the second semiconductor switch (MOSFET switch) may be symmetrical to each other to interrupt currents flowing in opposite directions. Meanwhile, a reactor 1003 that represents an inductance component generated by the load 2 may be considered. In normal conditions, current flows out of an anode of the power source 1, passes through the load 2, and flows into a cathode of the power source 1.

The bidirectional semiconductor circuit breaker according to one implementation of the present disclosure includes a snubber circuit unit (or snubber circuit) 1030 having one end connected in parallel with a front end of the first MOSFET switch 1001 and the other end connected in parallel with a rear end of the second MOSFET switch 1002. In consideration of directionality (or orientation) of the first and second MOSFET switches 1001 and 1002, one end and the other end of the snubber circuit unit 1030 may also be referred to as a front end and a rear end, respectively. That is, the one end and the other end of the snubber circuit unit 1030 are connected to different end portions of the first and second MOSFET switches 1001 and 1002, namely, the front end of the first MOSFET switch 1001 and the rear end of the second MOSFET switch 1002, respectively.

Meanwhile, the snubber circuit unit 1030 may include a plurality of circuit lines. In detail, the snubber circuit unit 1030 includes a first circuit line in which a first capacitor 1031 and a first diode 1033 are arranged in series. The snubber circuit unit 1030 may further include a second circuit line connected in parallel with the first circuit line, and having a second capacitor 1035 and a second diode 1034 arranged in series. In addition, the snubber circuit unit 1030 may further include a third circuit line having one end connected in series with the first circuit line and the other end connected in series with the second circuit line, and having resistors (first resistor and second resistor) 1032 arranged in series.

The snubber circuit unit 1030 is embedded in a snubber circuit module, namely, the first protection module 30. In other words, the snubber circuit unit 1030 for protecting the semiconductor switches 1001 and 1002 of the bidirectional semiconductor circuit breaker is embedded in the first protection module 30 that is separated (or divided) from the enclosure 11 of the circuit breaker, so as to be detachably connected to the main circuit.

A first node 31a, a second node 31b, and a third node 31c of the snubber circuit unit 1030 are connected to the first connection terminals 31, respectively. Here, the first node 31a and the second node 31b respectively define front and rear ends of the first circuit line or the second circuit line, and the third node 31c defines a ground end of the third circuit line.

Figure 5:
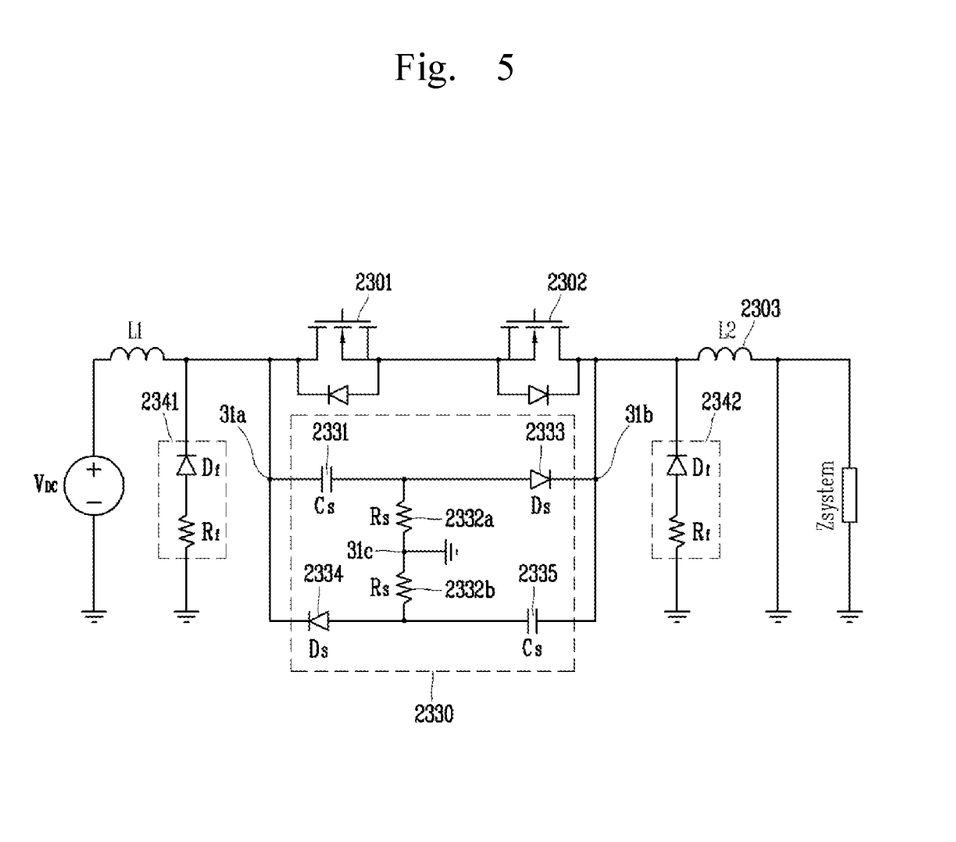
FIG. 5 is a circuit diagram of a bidirectional semiconductor circuit breaker according to another implementation of the present disclosure.

FIG. 5 illustrates another example of a bidirectional semiconductor circuit breaker structure in which a freewheeling circuit is provided. A bidirectional semiconductor circuit breaker to which a freewheeling circuit is added may include a main circuit unit, a snubber circuit unit 2330, and first and second freewheeling circuits 2341 and 2342.

The main circuit unit is connected between a power source and a load (Zsystem), and first and second semiconductor switches 2301 and 2302 are arranged in series.

The snubber circuit unit 2330 is configured such that one end is connected to a front end of the first semiconductor switch 2301 and the other end is connected in parallel with a rear end of the second semiconductor switch 2302.

Here, the first semiconductor switch 2301 may be configured such that a first MOSFET and a first parallel diode are connected in parallel. Also, the second semiconductor switch 2301 may be configured such that a second MOSFET and a second parallel diode are connected in parallel.

Meanwhile, the first MOSFET and the second MOSFET may be N-channel MOSFETs. Here, one end and the other end of the first parallel diode may be connected to a source and a drain of the first MOSFET, respectively. In addition, one end and the other end of the second parallel diode may be connected to a drain and a source of the second MOSFET, respectively. As such, the bidirectional semiconductor circuit breaker according to the present disclosure may be implemented by the first and second semiconductor switches 2301 and 2302 configured in a complementary symmetrical shape.

The snubber circuit unit 2330 includes a first circuit line having a first capacitor 2331 (Cs) and a first diode 2333 (Ds) arranged in series. In addition, the snubber circuit unit 2330 further includes a second circuit line that is connected in parallel with the first circuit line, and has a second diode 2334 (Ds) and a second capacitor 2335 (Cs) arranged in series. Here, the first circuit line may be connected in series in the order of the first capacitor 2331 and the first diode 2333, and the second circuit line may be connected in series in the order of the second diode 2334 and the second capacitor 2335.

The snubber circuit unit 2330 may further include a third circuit line having one end connected to the first circuit line and the other end connected to the second circuit line, and having a first resistor 2332a (Rs) and a second resistor 2332b (Rs) arranged in series. Here, one end of the third circuit line may be connected to the other end of the first capacitor 2331 and one end of the first diode 2333. Also, the other end of the third circuit line may be connected to one end of the second diode 2334 and the other end of the second capacitor 2335.

Meanwhile, the first resistor 2332a and the second resistor 2332b may be connected to a ground point therebetween. Also, the snubber circuit unit 2330 may be configured in a point symmetrical shape with respect to the ground point.

Due to the first resistor 2332a and the second resistor 2332b, a voltage drop caused by a fault current flowing into the snubber circuit unit 2330 may be increased. Accordingly, the first resistor 2332a and the second resistor 2332b may provide the ground point, which is a ground path through which the fault current flows, at a connection point between the first resistor 2332a and the second resistor 2332b. The first resistor 2332a and the second resistor 2332b may be configured as non-linear resistor elements, and be connected in series with each other.

Meanwhile, the first freewheeling circuit 2341 including a third diode Df and a third resistor Rf is formed at an input portion of the circuit breaker, and is configured to suppress the occurrence of overvoltage during trip operation of the circuit breaker. In detail, the first freewheeling circuit 2341 includes the third diode Df connected in parallel with the power source at a power node of the first semiconductor switch 2301. In addition, the first freewheeling circuit 2341 further includes the third resistor Rf connected in parallel between the third diode Df and a ground.

The second freewheeling circuit 2342 including a fourth diode Df and a fourth resistor Rf is formed at an output portion of the circuit breaker. In detail, the second freewheeling circuit 2342 includes the fourth diode Df connected in parallel with the load (Z system) at a load node of the second semiconductor switch 2302. In addition, the second freewheeling circuit 2342 further includes the fourth resistor Rf connected in parallel between the fourth diode Df and a ground.

Here, the power source may include a source-side inductor component, and the load (Z system) may include a load-side inductor component. In this regard, the source-side inductor component may be equivalent to a first inductor L1 connected to the power source. On the other hand, the load-side inductor component may be equivalent to a second inductor L2 connected to the load (Z system).

The snubber circuit unit 2330 is embedded in a snubber circuit module, namely, the first protection module 30. In other words, the snubber circuit unit 2330 for protecting the semiconductor switches 2301 and 2302 of the bidirectional semiconductor circuit breaker is embedded in the first protection module 30, which is separated from the enclosure 11 of the circuit breaker, to be detachably connected to the main circuit.

A first node 31a, a second node 31b, and a third node 31c of the snubber circuit unit 2330 are connected to the first connection terminals 31, respectively. Here, the first node 31a and the second node 31b respectively define front and rear ends of the first circuit line or the second circuit line, and the third node 31c defines a ground end of the third circuit line.

Figure 6:
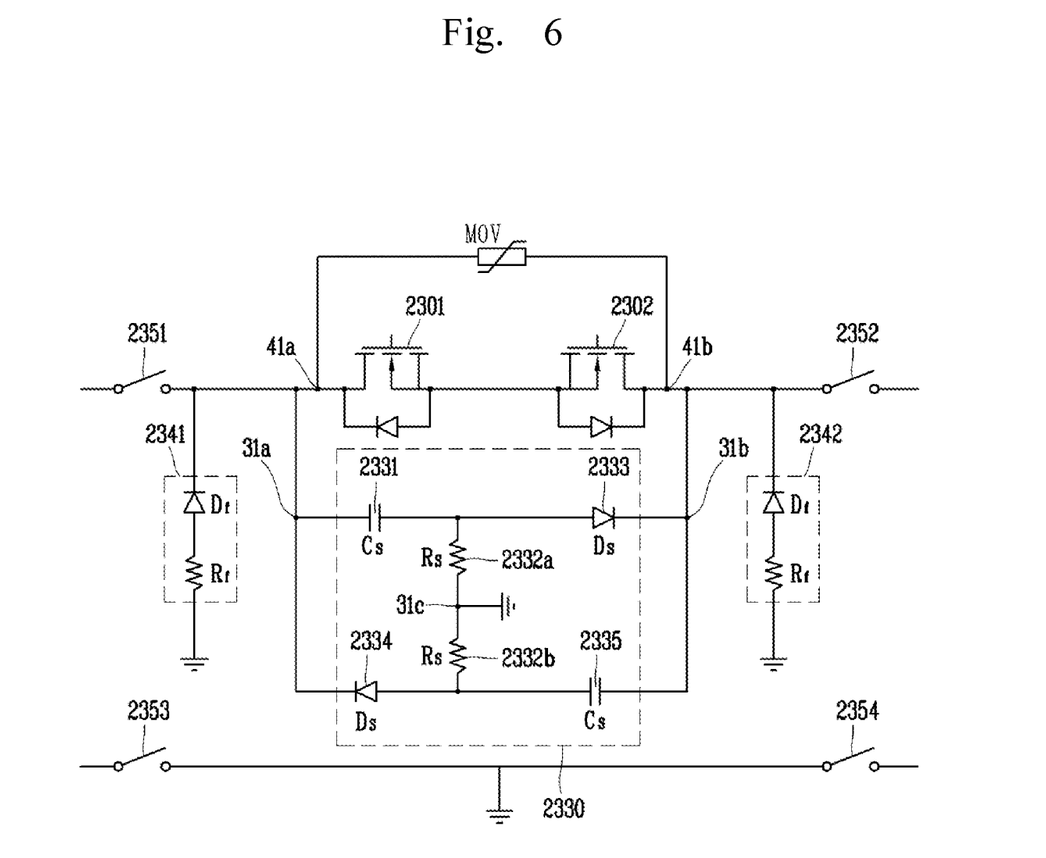
FIG. 6 is a circuit diagram of a bidirectional semiconductor circuit breaker according to yet another implementation of the present disclosure.

In addition, the semiconductor circuit breaker should provide reliable physical isolation and overvoltage protection after interruption is completed. FIG. 6 illustrates a circuit structure in which a semiconductor circuit breaker and mechanical switches are connected in series to both left and right contacts or one contact. Therefore, the bidirectional circuit breaker according to the present disclosure may have a circuit structure in which mechanical switches 2351 to 2354 are connected in series with the circuit breaker to left and right contacts or one contact, so as to ensure physical insulation and overvoltage protection after interruption is completed.

Here, after interruption operation of the semiconductor switches, the mechanical switches 2351 to 2354 are opened through a separate signal or a time delay to maintain physical insulation of the circuit breaker. In addition, an MOV may be disposed in parallel with the first and second semiconductor switches 2301 and 2302, so as to suppress an overvoltage. As for the MOV, when a voltage applied to the semiconductor switch is greater than or equal to a predetermined voltage, a resistance value becomes almost zero (0), allowing a current path to be changed. Accordingly, when a voltage applied to the first and second semiconductor switches 2301 and 2302 is greater than or equal to the predetermined voltage, the MOV may dump current to another path. For example, the current path may be changed to a path by the MOV, rather than a path by the first and second semiconductor switches 2301 and 2302, and a path by the snubber circuit unit 2330.

When a source-side inductance L1 is too large during interruption operation of the semiconductor circuit breaker, the snubber circuit 2330 alone may not sufficiently suppress an overvoltage. At this time, the overvoltage may be suppressed through a MOV circuit. Thus, the semiconductor device of the circuit breaker may be protected from an external surge.

The MOV is embedded in an MOV module, namely, the second protection module 40. In other words, the MOV for protecting the semiconductor switches 2301 and 2302 of the bidirectional semiconductor circuit breaker is embedded in the second protection module 40, which is separated from the enclosure 11 of the circuit breaker, to be detachably connected to the main circuit.

A first node 41a and a second node 41b of the MOV are connected to the second connect terminals 41, respectively. Here, the first node 41a and the second node 41b of the MOV define a front end of the first semiconductor switch 2301 and a rear end of the second semiconductor switch 2302, respectively.

According to the semiconductor circuit breaker of the implementations of the present disclosure, the protection circuit including the snubber circuit or the MOV element is configured as a separate module that can be detached from the enclosure. Therefore, the protection circuit with a high damage rate can be easily replaced. Further, when there is an increase or decrease in the capacity of the circuit breaker, it can be replaced with a protection module suitable for such capacity.

For detailed operation of the interruption operation in the circuit of the bidirectional semiconductor circuit breaker configured in this specification, reference may be made to Korean Patent Application No. 10-2019-0042659 "Bidirectional Semiconductor Circuit Breaker" filed by the present applicant.

While the disclosure has been shown and described with reference to the foregoing preferred implementations thereof, it will be understood by those skilled in the art that various changes and modifications may be made without departing from the spirit and scope of the disclosure as defined by the appended claims. Therefore, the implementations disclosed in the present disclosure are not intended to limit the scope of the present disclosure but are merely illustrative, and it should be understood that the scope of the technical idea of the present disclosure is not limited by those implementations. That is, the scope of protection of the present disclosure should be construed according to the appended claims, and all technical ideas within the scope of equivalents thereof should be construed as being included in the scope of the present disclosure.

The invention claimed is:

1. A semiconductor circuit breaker comprising:
a main circuit unit connected between a power source and a load, and provided with a semiconductor switch;
an enclosure having the main circuit unit embedded therein and a module accommodating unit provided at an outside thereof; and
a protection module detachably accommodated in the module accommodating unit,
wherein the protection module includes a first protection module and a second protection module,
wherein the module accommodating unit is provided with a connection socket connected to the power source or a ground, and wherein the connection socket includes a first connection socket to which the first protection module is connected, and a second connection socket to which the second protection module is connected.

2. The semiconductor circuit breaker of claim 1, wherein a snubber circuit unit for protecting the semiconductor switch is embedded in the first protection module.

3. The semiconductor circuit breaker of claim 1, wherein a metal oxide varistor (MOV) for protecting the semiconductor switch is embedded in the second protection module.

4. The semiconductor circuit breaker of claim 3, wherein the module accommodating unit is configured as a groove on a portion of the enclosure.

5. The semiconductor circuit breaker of claim 1, wherein the first protection module is provided with a first connection terminal that is connected to the first connection socket, and the second protection module is provided with a second connection terminal that is connected to the second connection socket.

6. The semiconductor circuit breaker of claim 1, wherein a guide portion for guiding and supporting insertion and mounting of the protection module is formed at the module accommodating unit, and
wherein a guide inserted into the guide portion is formed at the protection module.

7. The semiconductor circuit breaker of claim 5, wherein the semiconductor switch includes a first semiconductor switch and a second semiconductor switch that are symmetrical to each other, so as to operate in response to currents flowing in opposite directions, respectively.

8. The semiconductor circuit breaker of claim 7, wherein a snubber circuit unit for protecting the semiconductor switch is embedded in the first protection module, wherein the snubber circuit unit includes:
a first circuit line in which a first capacitor and a first diode are arranged in series;
a second circuit line connected in parallel with the first circuit line, and in which a second capacitor and a second diode are arranged in series; and
a third circuit line having one end connected to the first circuit line and the other end connected to the second circuit line, and in which a first resistor and a second resistor are arranged in series, and
wherein a ground terminal connected between front and rear ends of the first circuit line or the second circuit line, and a ground terminal connected between the first and second resistors of the third circuit line are connected to the first connection terminal.

9. The semiconductor circuit breaker of claim 8, wherein a metal oxide varistor (MOV) for protecting the semiconductor switch is embedded in the second protection module, wherein one end and the other end of the MOV are connected to front and rear ends of the semiconductor switch, respectively.

* * * * *